US011949405B2

United States Patent
Uehara et al.

(10) Patent No.: US 11,949,405 B2
(45) Date of Patent: Apr. 2, 2024

(54) DOUBLE MODE SURFACE ACOUSTIC WAVE (SAW) FILTER

(71) Applicant: WISOL CO., LTD., Osan-si (KR)

(72) Inventors: Kensei Uehara, Osan-si (KR); Takahiro Sato, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 428 days.

(21) Appl. No.: 17/325,431

(22) Filed: May 20, 2021

(65) Prior Publication Data

US 2021/0367585 A1 Nov. 25, 2021

(30) Foreign Application Priority Data

May 20, 2020 (KR) ........................ 10-2020-0060366

(51) Int. Cl.
*H03H 9/64* (2006.01)
*H03H 9/02* (2006.01)
*H03H 9/145* (2006.01)

(52) U.S. Cl.
CPC ...... *H03H 9/6436* (2013.01); *H03H 9/02559* (2013.01); *H03H 9/145* (2013.01)

(58) Field of Classification Search
CPC .. H03H 9/6436; H03H 9/02559; H03H 9/145; H03H 9/02952; H03H 9/542; H03H 9/02015; H03H 9/14538; H03H 9/64

USPC .......................................... 333/133, 193–196
See application file for complete search history.

(56) References Cited

U.S. PATENT DOCUMENTS 7,408,284 B1* 8/2008 Loseu .................. H03H 9/6406
333/195

FOREIGN PATENT DOCUMENTS

KR 10-2012-0118042 A 10/2012

* cited by examiner

*Primary Examiner* — Rakesh B Patel
*Assistant Examiner* — Jorge L Salazar, Jr.
(74) *Attorney, Agent, or Firm* — LRK PATENT LAW FIRM

(57) ABSTRACT

A double mode SAW (DMS) filter includes: a plurality of interdigital transducers (IDTs), each having a plurality of Type 1 electrode fingers and a plurality of Type 2 electrode fingers formed on a piezoelectric substrate, wherein one Type 2 electrode finger among the plurality of Type 2 electrode fingers is disposed between two adjacent Type 1 electrode fingers among the plurality of Type 1 electrode fingers, and in a first IDT and a second IDT included in the plurality of IDTs to be adjacent to each other, one Type 1 electrode finger of the second IDT is disposed between two Type 1 electrode fingers of the first IDT. Accordingly, it is possible to provide a DMS filter capable of improving the amount of attenuation in an attenuation band adjacent to the wide band side for the passband and miniaturizing a product by saving space.

9 Claims, 12 Drawing Sheets

DOUBLE MODE SURFACE ACOUSTIC WAVE (SAW) FILTER

CROSS-REFERENCE TO RELATED APPLICATION(S)

This application claims priority to Korean Patent Application No. 10-2020-0060366, filed May 20, 2020, in Korean Intellectual Property Office, the disclosure of which is incorporated herein by reference for all purposes.

BACKGROUND OF THE INVENTION

1. Field of the Invention

The technique disclosed in this application relates to a double mode Surface Acoustic Wave (SAW) filter.

2. Description of Related Art

A filter having a plurality of interdigital transducers (IDTs) disposed on a piezoelectric substrate to be adjacent to each other in the transverse direction, and two reflectors disposed on the piezoelectric substrate to insert the plurality of IDTs therebetween is known as a longitudinally coupled double mode surface acoustic wave (DMS) filter.

As shown in FIG. 1, when a reception band is adjacent to a transmission band and the frequency of the reception band is lower than the frequency of the transmission band, the reception filter needs to increase the amount of attenuation in an attenuation band adjacent to the wide band side for the passband. In addition, as shown in FIG. 2, in an antenna duplexer for sharing one antenna among two or more bands, it needs to increase the amount of attenuation in the attenuation bands adjacent to both the low side and the high side of the passband.

Conventionally, a method of improving the amount of attenuation in an attenuation band adjacent to the wide band side for the passband by connecting a capacitance provided between input and output terminals of the DMS in addition to the DMS is known. In the case of using such a method, it is difficult to achieve reduction of a product size since a separate space for the capacitance and wiring for connection is required in the piezoelectric substrate.

Therefore, an object of this application is to provide a DMS filter capable of improving the amount of attenuation in an attenuation band adjacent to the wide band side for the passband and miniaturizing a product by saving space according to various embodiments.

SUMMARY OF THE INVENTION

An object of the present invention is to provide a DMS filter with improved performance.

Another object of the present invention is to provide a DMS filter capable of improving the amount of attenuation in an attenuation band adjacent to the wide band side for the passband and miniaturizing a product by saving space.

The problems of the present invention are not limited to the problems mentioned above, and unmentioned other problems will be clearly understood by those skilled in the art from the following description.

To accomplish the above objects, according to one aspect of the present invention, there is provided a double mode SAW (DMS) filter comprising: a plurality of interdigital transducers (IDTs), each having a plurality of Type 1 electrode fingers and a plurality of Type 2 electrode fingers formed on a piezoelectric substrate, wherein one Type 2 electrode finger among the plurality of Type 2 electrode fingers is disposed between two adjacent Type 1 electrode fingers among the plurality of Type 1 electrode fingers, and in a first IDT and a second IDT included in the plurality of IDTs to be adjacent to each other, one Type 1 electrode finger of the second IDT is disposed between two Type 1 electrode fingers of the first IDT.

In an embodiment, in the first IDT and the second IDT, one Type 1 electrode finger of the first IDT is disposed between two Type 1 electrode fingers of the second IDT.

In an embodiment, in the first IDT and the second IDT, one Type 1 electrode finger of the second IDT is disposed between two adjacent Type 1 electrode fingers among three Type 1 electrode fingers of the first IDT.

In an embodiment, in the first IDT and the second IDT, one Type 1 electrode finger of the first IDT is disposed between two adjacent Type 1 electrode fingers among three Type 1 electrode fingers of the second IDT.

In an embodiment, in the second IDT and a third IDT included in the plurality of IDTs to be adjacent to each other, one Type 1 electrode finger of the third IDT is disposed between two Type 1 electrode fingers of the second IDT.

In an embodiment, in the second IDT and the third IDT, one Type 1 electrode finger of the second IDT is disposed between two Type 1 electrode fingers of the third IDT.

In an embodiment, in the second IDT and the third IDT, one Type 1 electrode finger of the third IDT is disposed between two adjacent Type 1 electrode fingers among three Type 1 electrode fingers of the second IDT.

In an embodiment, in the second IDT and the third IDT, one Type 1 electrode finger of the second IDT is disposed between two adjacent Type 1 electrode fingers among three Type 1 electrode fingers of the third IDT.

In an embodiment, each Type 1 electrode finger is connected to a signal line, and each Type 2 electrode finger is grounded.

In an embodiment, the piezoelectric substrate is formed of $LiTAO_3$ or $LiNAO_3$.

In an embodiment, the double mode SAW (DMS) filter further comprises a first reflector and a second reflector disposed to insert the plurality of IDTs therebetween.

A duplexer according to an embodiment of the present invention is a duplexer provided with a double mode SAW (DMS) filter, and the DMS filter comprises: a plurality of interdigital transducers (IDTs), each having a plurality of Type 1 electrode fingers and a plurality of Type 2 electrode fingers formed on a piezoelectric substrate, wherein one Type 2 electrode finger among the plurality of Type 2 electrode fingers is disposed between two adjacent Type 1 electrode fingers among the plurality of Type 1 electrode fingers, and in a first IDT and a second IDT included in the plurality of IDTs to be adjacent to each other, one Type 1 electrode finger of the second IDT is disposed between two Type 1 electrode fingers of the first IDT.

In a duplexer according to an embodiment, in the second IDT and a third IDT included in the plurality of IDTs to be adjacent to each other, one Type 1 electrode finger of the third IDT is disposed between two Type 1 electrode fingers of the second IDT.

DETAILED DESCRIPTION OF THE PREFERRED EMBODIMENTS

Figure 1:
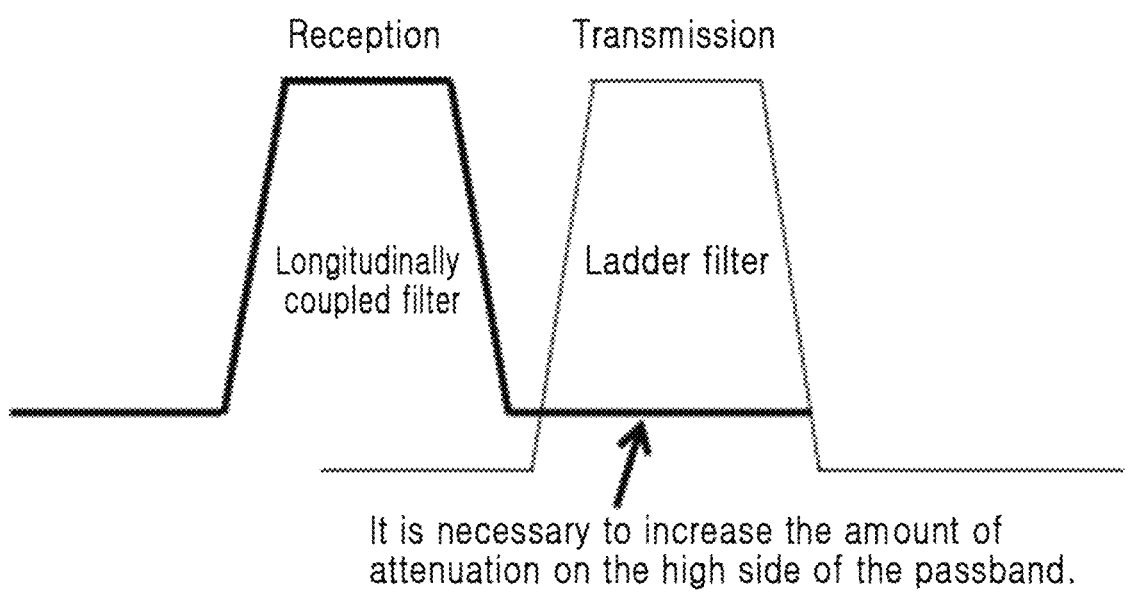
FIG. 1 is a mimetic view showing an example of a passband and an attenuation band of a filter.
Figure 2:
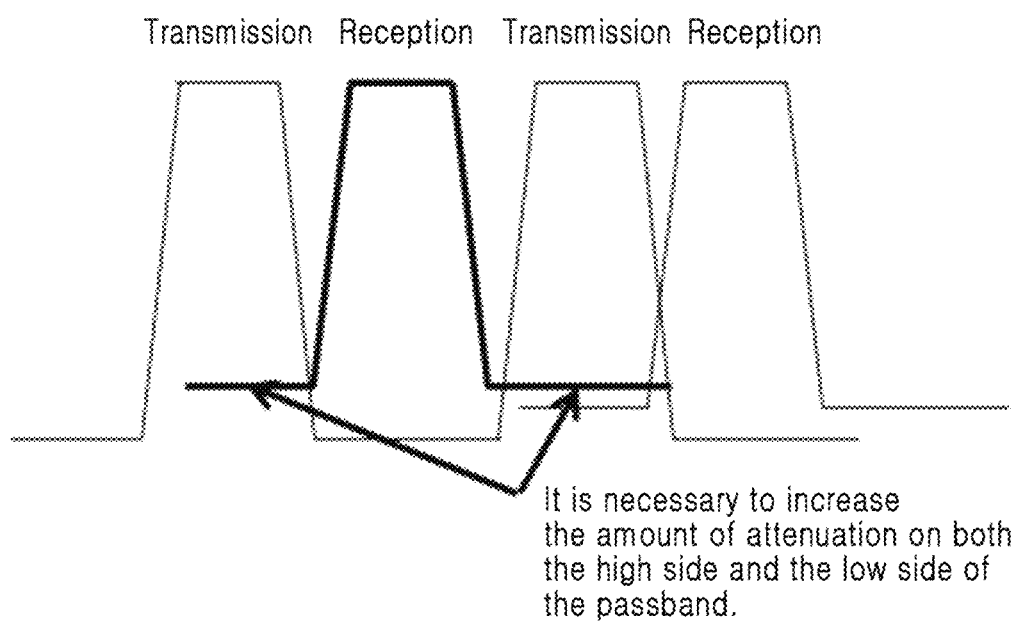
FIG. 2 is a mimetic view showing another example of a passband and an attenuation band of a filter.

Hereinafter, various embodiments of the present invention will be described with reference to the accompanying drawings. In the drawings, common components are assigned with the same reference numeral. In addition, it should be noted that components expressed in a certain drawing may be omitted in another drawing for convenience of explanation. In addition, it should also be noted that the accompanying drawings are not necessarily drawn in an accurate scale.

Unless otherwise defined, all the terms (including technical and scientific terms) used in this specification may be used as a meaning that can be commonly understood by those skill in the art. In addition, the terms defined in a commonly used dictionary are not interpreted ideally or excessively unless explicitly and specifically defined. The terms used in this specification are for describing embodiments and are not intended to limit the present invention. In this specification, singular forms also include plural forms unless specifically stated in a phrase.

The terms "comprises" and "comprising" used in this specification do not exclude presence or addition of one or more other components, steps, operations or elements with regard to mentioned components, steps, operations or elements.

1. General DMS Filter

In the case of a general double mode surface acoustic wave filter (DMS filter), combinations of two adjacent electrode fingers between two adjacent interdigital transducers (IDTs) are as follows.

Figure 4:
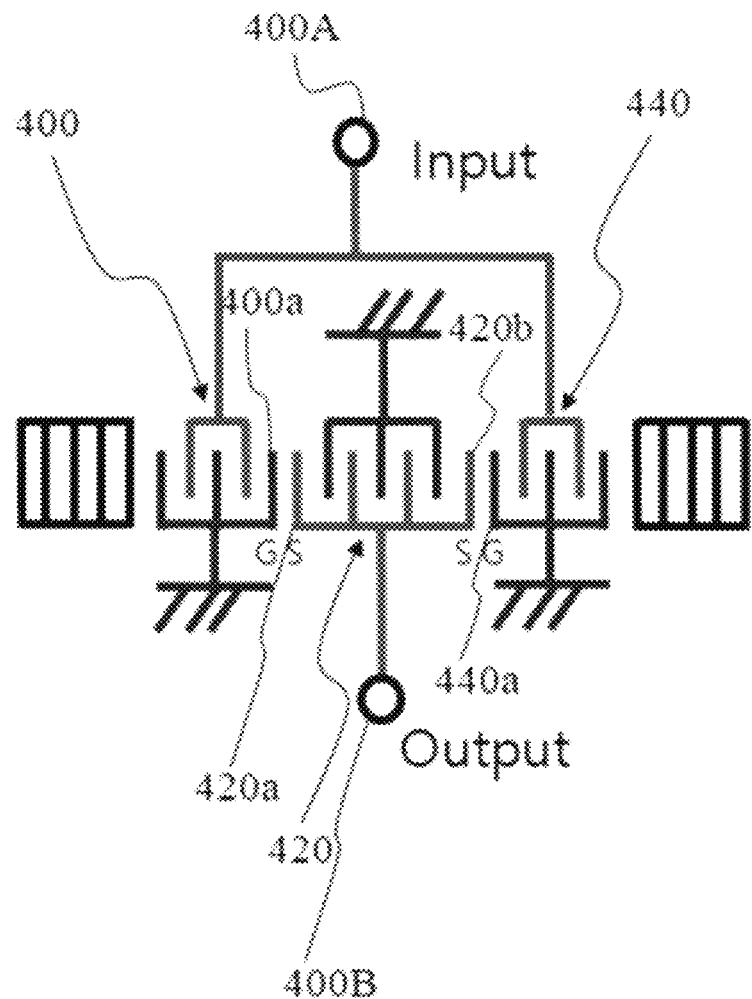
FIG. 4 is a mimetic view showing the configuration of a general DMS filter using a second method.
Figure 5:
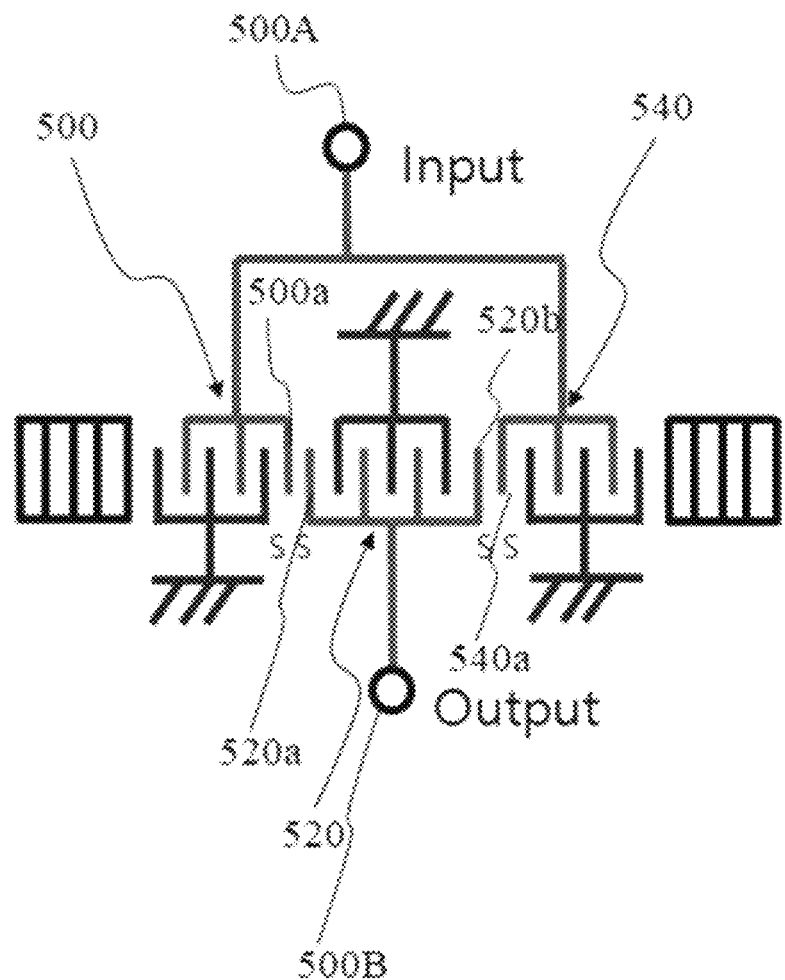
FIG. 5 is a mimetic view showing the configuration of a general DMS filter using a third method.

(1) Gnd-Gnd (G-G) (See FIG. 3 according to first method)
(1) Gnd-Signal (G-S) (See FIG. 4 according to second method)
(1) Signal-Gnd (S-G) (See FIG. 4 according to second method)
(1) Signal-Signal (S-S) (See FIG. 5 according to third method)

1-1. First Method

Figure 3:
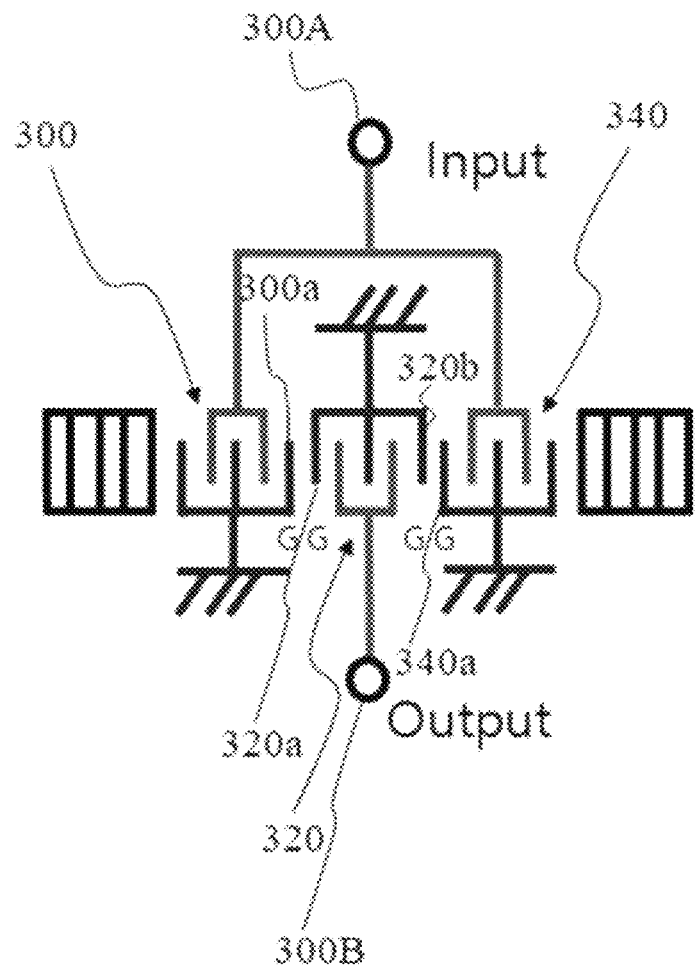
FIG. 3 is a mimetic view showing the configuration of a general DMS filter using a first method.

FIG. 3 is a mimetic view showing the configuration of a general DMS filter using a first method. The DMS filter shown in FIG. 3 may include three IDTs 300, 320 and 340 disposed in the transverse direction (horizontal direction).

The electrode finger 300a of the IDT 300 is adjacent to the electrode finger 320a of the IDT 320. The electrode finger 300a and the electrode finger 320a are grounded together. Therefore, the electrode finger 300a and the electrode finger 320a are in a relationship of Gnd-Gnd.

The electrode finger 320b of the IDT 320 is adjacent to the electrode finger 340a of the IDT 340. The electrode finger 320b and the electrode finger 340a are grounded together. Therefore, the electrode finger 320b and the electrode finger 340a are in a relationship of Gnd-Gnd.

Therefore, there is substantially no capacitance between the input terminal 300A and the output terminal 300B in the DMS filter shown in FIG. 3.

1-2. Second Method

FIG. 4 is a mimetic view showing the configuration of a general DMS filter using a second method. The DMS filter shown in FIG. 4 may include three IDTs 400, 420 and 440 disposed in the transverse direction.

The electrode finger 400a of the IDT 400 is adjacent to the electrode finger 420a of the IDT 420. The electrode finger 400a is grounded. The electrode finger 420a is connected to the signal line. Therefore, the electrode finger 400a and the electrode finger 420a are in a relationship of Gnd-Signal.

The electrode finger 420b of the IDT 420 is adjacent to the electrode finger 440a of the IDT 440. The electrode finger 420b is connected to the signal line. The electrode finger 440a is grounded. Therefore, the electrode finger 420b and the electrode finger 440a are in a relationship of Signal-Gnd.

Therefore, there is substantially no capacitance between the input terminal 400A and the output terminal 400B in the DMS filter shown in FIG. 4.

1-3. Third Method

FIG. 5 is a mimetic view showing the configuration of a general DMS filter using a third method. The DMS filter shown in FIG. 5 may include three IDTs 500, 520 and 540 disposed in the transverse direction.

The electrode finger 500a of the IDT 500 is adjacent to the electrode finger 520a of the IDT 520. The electrode finger 500a is connected to the input terminal 500A via a signal line. The electrode finger 520a is connected to the output terminal 500B via a signal line. Therefore, the electrode finger 500a and the electrode finger 520a are in a relationship of Signal-Signal.

The electrode finger 520b of the IDT 520 is adjacent to the electrode finger 540a of the IDT 540. The electrode finger 520b is connected to the output terminal 500B via a signal line. The electrode finger 540a is connected to the input terminal 500A via a signal line. Therefore, the electrode finger 520b and the electrode finger 540a are in a relationship of Signal-Signal.

Accordingly, in the DMS filter shown in FIG. 5, the electrode finger 500a connected to the input terminal 500A and the electrode finger 520a connected to the output terminal 500B face each other. In addition, the electrode finger 520b connected to the output terminal 500B and the electrode finger 540a connected to the input terminal 500A face each other. Accordingly, a small capacitance exists between the input terminal 500A and the output terminal 500B. However, this capacitance value cannot be controlled.

1-4. Fourth Method

Figure 6:
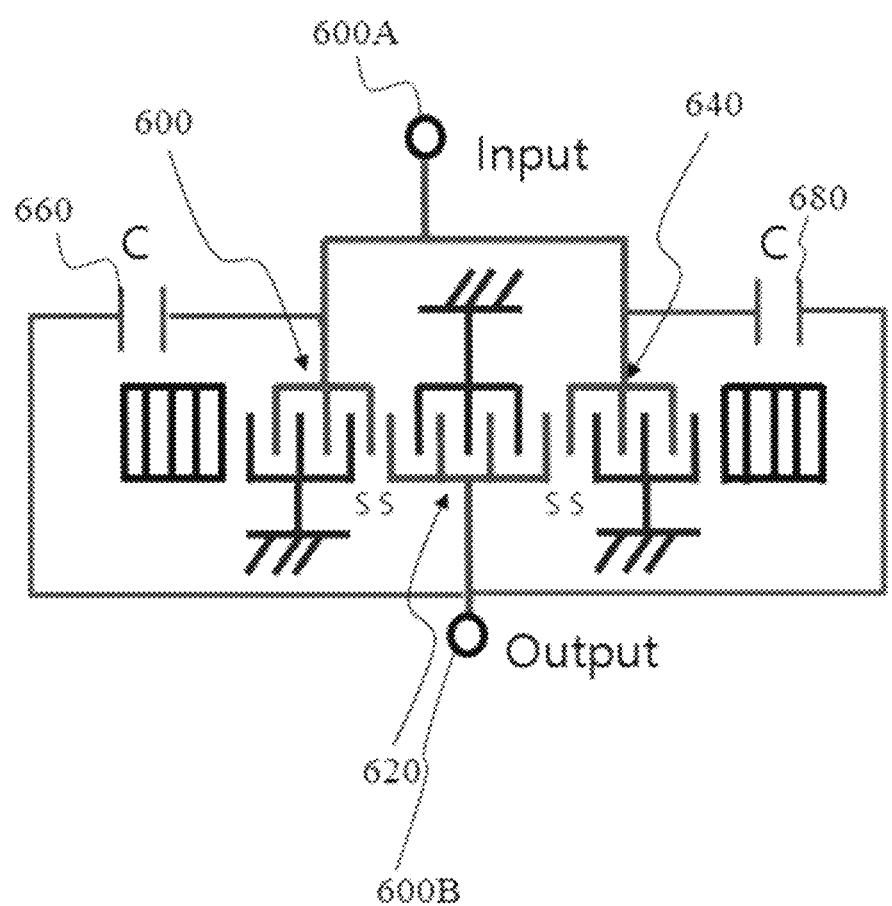
FIG. 6 is a mimetic view showing the configuration of a general DMS filter using a fourth method.

FIG. 6 is a mimetic view showing the configuration of a general DMS filter using a fourth method. The DMS filter shown in FIG. 6 may include three IDTs 600, 620 and 640 disposed in the transverse direction.

For example, two capacitances 660 and 680 added to the outside of the DMS filter may be connected between the input terminal 600A and the output terminal 600B. In this fourth method, it is possible to control the value of these capacitances by selecting a capacitance 660 or 680 that is used.

However, since this fourth method additionally requires a space for the capacitances 660 and 680 and a space for wiring to connect the capacitances and the DMS filter, it is difficult to reduce the product size.

2. DMS Filter According to Various Embodiments

Figure 7:
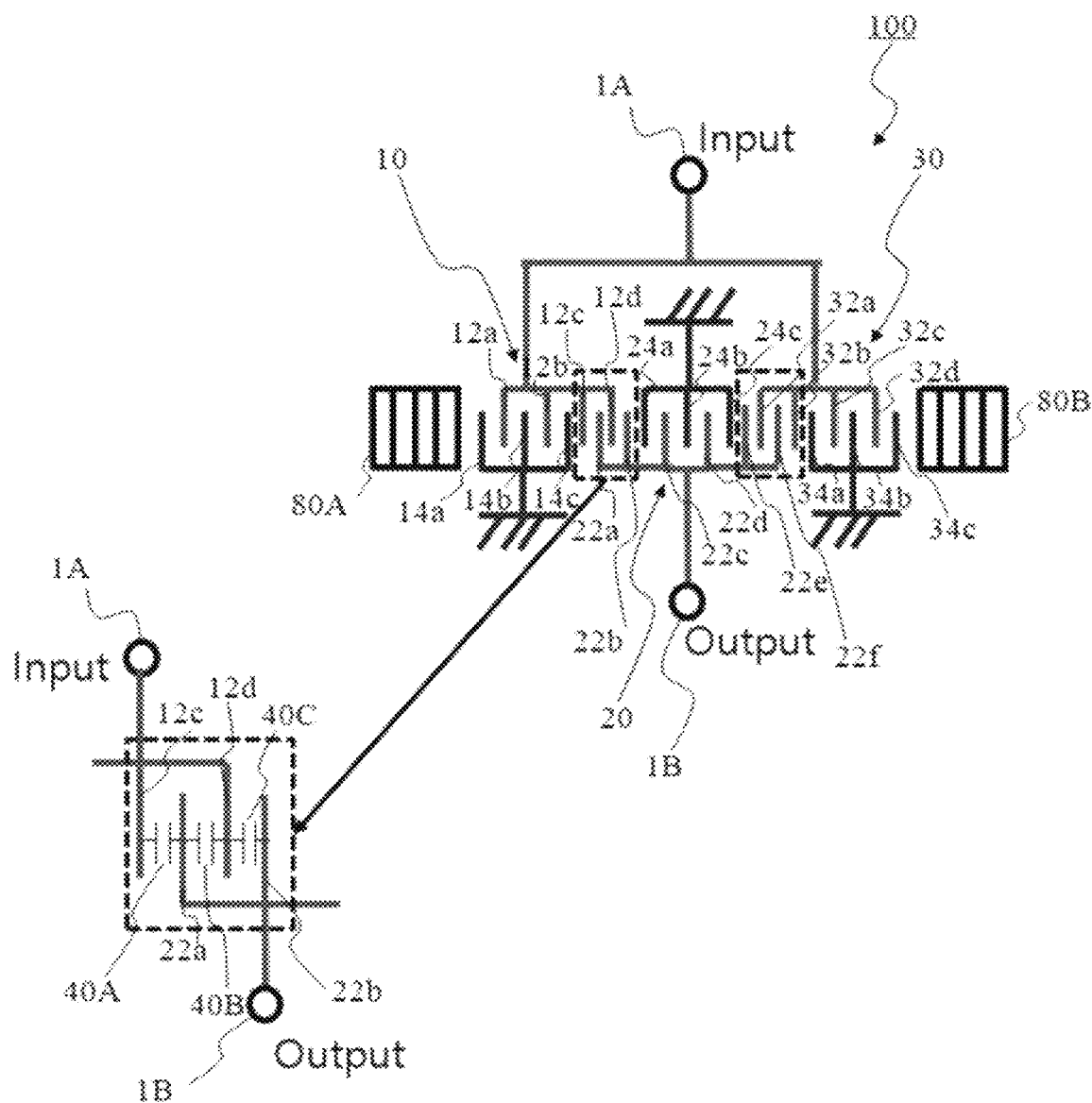
FIG. 7 is a mimetic view showing an example of the configuration of a DMS filter according to an embodiment.

FIG. 7 is a mimetic view showing an example of the configuration of a DMS filter according to an embodiment of the present invention.

As shown in FIG. 7, the DMS filter 100 according to an embodiment may mainly include a plurality of IDTs 10, 20 and 30 formed on a piezoelectric substrate (not shown), and a first reflector 80A and a second reflector 80B arranged to insert the plurality of IDTs therebetween. An example in which three IDTs, i.e., a first IDT 10, a second IDT 20, and a third IDT 30, are formed as the plurality of IDTs is shown in FIG. 7. In addition, the piezoelectric substrate (not shown) is formed of an arbitrary piezoelectric material, e.g., $LiTaO_3$ or $LiNaO_3$.

2-1. First IDT 10

The first IDT 10 may include a plurality of Type 1 electrode fingers 12 and a plurality of Type 2 electrode fingers 14. Four Type 1 electrode fingers 12a, 12b, 12c and 12d are shown in FIG. 7 as an example of the plurality of Type 1 electrode fingers 12. The plurality of Type 1 electrode fingers 12 may be connected to the input terminal 1A via a signal line.

In addition, three Type 2 electrode fingers 14a, 14b and 14c are shown in FIG. 7 as an example of the plurality of Type 2 electrode fingers. The plurality of Type 2 electrode fingers 14 may be grounded via a signal line.

One Type 2 electrode finger 14 may be disposed between two adjacent Type 1 electrode fingers 12. For example, one Type 2 electrode finger 14b may be disposed between two adjacent Type 1 electrode fingers 12a and 12b, and one Type 2 electrode finger 14c may be disposed between two adjacent Type 1 electrode fingers 12b and 12c.

In addition, one Type 1 electrode finger 12 may be disposed between two adjacent Type 2 electrode fingers 14. For example, one Type 1 electrode finger 12a may be disposed between two adjacent Type 2 electrode fingers 14a and 14b, and one Type 1 electrode finger 12b may be disposed between two adjacent Type 2 electrode fingers 14b and 14c.

2-2. Second IDT 20

The second IDT 20 may include a plurality of Type 1 electrode fingers 22 and a plurality of Type 2 electrode fingers 24. Six Type 1 electrode fingers 22a, 22b, 22c, 22d, 22e and 22f are shown in FIG. 7 as an example of the plurality of Type 1 electrode fingers 22. The plurality of Type 1 electrode fingers 22 may be connected to the output terminal 1B via a signal line.

In addition, three Type 2 electrode fingers 24a, 24b and 24c are shown in FIG. 7 as an example of the plurality of Type 2 electrode fingers. The plurality of Type 2 electrode fingers 24 may be grounded via a signal line.

One Type 2 electrode finger 24 may be disposed between two adjacent Type 1 electrode fingers 22. For example, one Type 2 electrode finger 24a may be disposed between two adjacent Type 1 electrode fingers 22b and 22c, one Type 2 electrode finger 24b may be disposed between two adjacent Type 1 electrode fingers 22c and 22d, and one Type 2 electrode finger 24c may be disposed between two adjacent Type 1 electrode fingers 22d and 22e.

In addition, one Type 1 electrode finger 22 may be disposed between two adjacent Type 2 electrode fingers 24. For example, one Type 1 electrode finger 22c may be disposed between two adjacent Type 2 electrode fingers 24a and 24b, and one Type 1 electrode finger 22d may be disposed between two adjacent Type 2 electrode fingers 12b and 24c.

2-3. Third IDT 30

The third IDT 30 may include a plurality of Type 1 electrode fingers 32 and a plurality of Type 2 electrode fingers 34. Four Type 1 electrode fingers 32a, 32b, 32c and 32d are shown in FIG. 7 as an example of the plurality of Type 1 electrode fingers 32. The plurality of Type 1 electrode fingers 32 may be connected to the input terminal 1A via a signal line.

In addition, three Type 2 electrode fingers 34a, 34b and 34c are shown in FIG. 7 as an example of the plurality of Type 2 electrode fingers. The plurality of Type 2 electrode fingers 34 may be grounded via a signal line.

One Type 2 electrode finger 34 may be disposed between two adjacent Type 1 electrode fingers 32. For example, one Type 2 electrode finger 34a may be disposed between two adjacent Type 1 electrode fingers 32b and 32c, and one Type 2 electrode finger 34b may be disposed between two adjacent Type 1 electrode fingers 32c and 32d.

In addition, one Type 1 electrode finger 32 may be disposed between two adjacent Type 2 electrode fingers 34. For example, one Type 1 electrode finger 32c may be disposed between two adjacent Type 2 electrode fingers 34a and 34b, and one Type 1 electrode finger 32d may be disposed between two adjacent Type 2 electrode fingers 34b and 34c.

2-4. Relation Between the First IDT 10 and the Second IDT 20

As shown in the enlarged view of a part of the first IDT 10 and a part of the second IDT 20 in the lower left part of FIG. 7, one Type 1 electrode finger 22a disposed on the outermost side (left side in the figure) of the second IDT 20 may be disposed between two Type 1 electrode fingers 12c and 12d disposed on the outermost side (right side in the figure) of the first IDT 10. In addition, one Type 1 electrode finger 12d disposed on the outermost side (right side in the figure) of the first IDT 10 may be disposed between two Type 1 electrode fingers 22a and 22b disposed on the outermost side (left side in the figure) of the second IDT 20.

Accordingly, a first capacitance 40A is formed between the Type 1 electrode finger 12c and the Type 1 electrode finger 22a facing thereto. In addition, a second capacitance 40B is formed between the Type 1 electrode finger 22a and the Type 1 electrode finger 12d facing (adjacent) thereto. Further, a third capacitance 40C is formed between the Type 1 electrode finger 12d and the Type 1 electrode finger 22d facing (adjacent) thereto. Here, when one Type 1 electrode finger 12 of the first IDT 10 and one Type 1 electrode finger 22 of the second IDT 20 facing (adjacent) thereto are considered as a pair of (two) Type 1 electrode fingers, a total of two pairs of (four) Type 1 electrode fingers 12c, 22a, 12d, and 22b are arranged in order. In this way, a total of three capacitances 40A, 40B and 40C are formed by arranging a total of two pairs of Type 1 electrode fingers in order. This means that the number of capacitances formed between the input terminal 1A and the output terminal 1B, i.e., the value of capacitance, may be controlled by increasing or decreasing the number of pairs of Type 1 electrode fingers 12 and 22 configured of one Type 1 electrode finger 12 of the first IDT 10 and one Type 1 electrode finger 22 of the second IDT 20.

The value of the first capacitance 40A depends on the distance between Type 1 electrode finger 12c and Type 1 electrode finger 22a. In the same way, the value of the second capacitance 40B depends on the distance between Type 1 electrode finger 22a and Type 1 electrode finger 12d, and the value of the third capacitance 40C depends on the distance between Type 1 electrode finger 12d and Type 1 electrode finger 22b. These distances are not independently adjusted, but determined by the pitch formed between two adjacent Type 1 electrode fingers 12 of the first IDT 10 and the pitch formed between two adjacent Type 1 electrode fingers 22 of the second IDT 20. These pitches may be inevitably determined by determining the characteristics of the DMS filter 100. Accordingly, the value of each capacitance may be inevitably determined by determining the characteristics of the DMS filter 100. Accordingly, the capacitance value formed by Type 1 electrode finger 12 of the first IDT 10 and Type 1 electrode finger 22 of the second IDT 20 between the input terminal 1A and the output terminal 1B may be controlled by increasing or decreasing the number of pairs of Type 1 electrode fingers 12 and 22 configured of one Type 1 electrode finger 12 of the first IDT 10 and one Type 1 electrode finger 22 of the second IDT 20.

2-5. Relation Between the Second IDT 20 and the Third IDT 30

As shown in FIG. 7, one Type 1 electrode finger 32a disposed on the outermost side (left side in the figure) of the third IDT 30 may be disposed between two Type 1 electrode fingers 22e and 22f disposed on the outermost side (right side in the figure) of the second IDT 20. In addition, one Type 1 electrode finger 22f disposed on the outermost side (right side in the figure) of the second IDT 20 may be disposed between two Type 1 electrode fingers 32a and 32b disposed on the outermost side (left side in the figure) of the third IDT 30.

Accordingly, a fourth capacitance is formed between the Type 1 electrode finger 22e and the Type 1 electrode finger 32a facing thereto. In addition, a fifth capacitance is formed between the Type 1 electrode finger 32a and the Type 1 electrode finger 22f facing (adjacent) thereto. Further, a sixth capacitance is formed between the Type 1 electrode finger 22f and the Type 1 electrode finger 32b facing (adjacent) thereto. Here, when one Type 1 electrode finger 22 of the second IDT 20 and one Type 1 electrode finger 32 of the third IDT 30 facing (adjacent) thereto are considered as a pair of (two) Type 1 electrode fingers, a total of two pairs of (four) Type 1 electrode fingers 22e, 32a, 22f, and 32b are arranged in order. In this way, a total of three capacitances are formed by arranging a total of two pairs of Type 1 electrode fingers in order. This means that the number of capacitances formed between the input terminal 1A and the output terminal 1B, i.e., the value of capacitance, may be controlled by increasing or decreasing the number of pairs of Type 1 electrode fingers 22 and 32 configured of one Type 1 electrode finger 22 of the second IDT 20 and one Type 1 electrode finger 32 of the third IDT 30.

The value of the fourth capacitance depends on the distance between Type 1 electrode finger 22e and Type 1 electrode finger 32a. In the same way, the value of the fifth capacitance depends on the distance between Type 1 electrode finger 32a and Type 1 electrode finger 22f, and the value of the sixth capacitance depends on the distance between Type 1 electrode finger 22f and Type 1 electrode finger 32b. These distances are not independently adjusted, but determined by the pitch formed between two adjacent Type 1 electrode fingers 22 of the second IDT 20 and the pitch formed between two adjacent Type 1 electrode fingers 32 of the third IDT 30. These pitches are inevitably determined by determining the characteristics of the DMS filter 100. Accordingly, the value of each capacitance is inevitably determined by determining the characteristics of the DMS filter 100. Accordingly, the capacitance value formed by Type 1 electrode finger 22 of the second IDT 20 and Type 1 electrode finger 32 of the third IDT 30 between the input terminal 1A and the output terminal 1B may be controlled by increasing or decreasing the number of pairs of Type 1 electrode fingers 22 and 32 configured of one Type 1 electrode finger 22 of the second IDT 20 and one Type 1 electrode finger 32 of the third IDT 30.

2-6. Results of Experiment on the Number of Pairs

Figure 8:
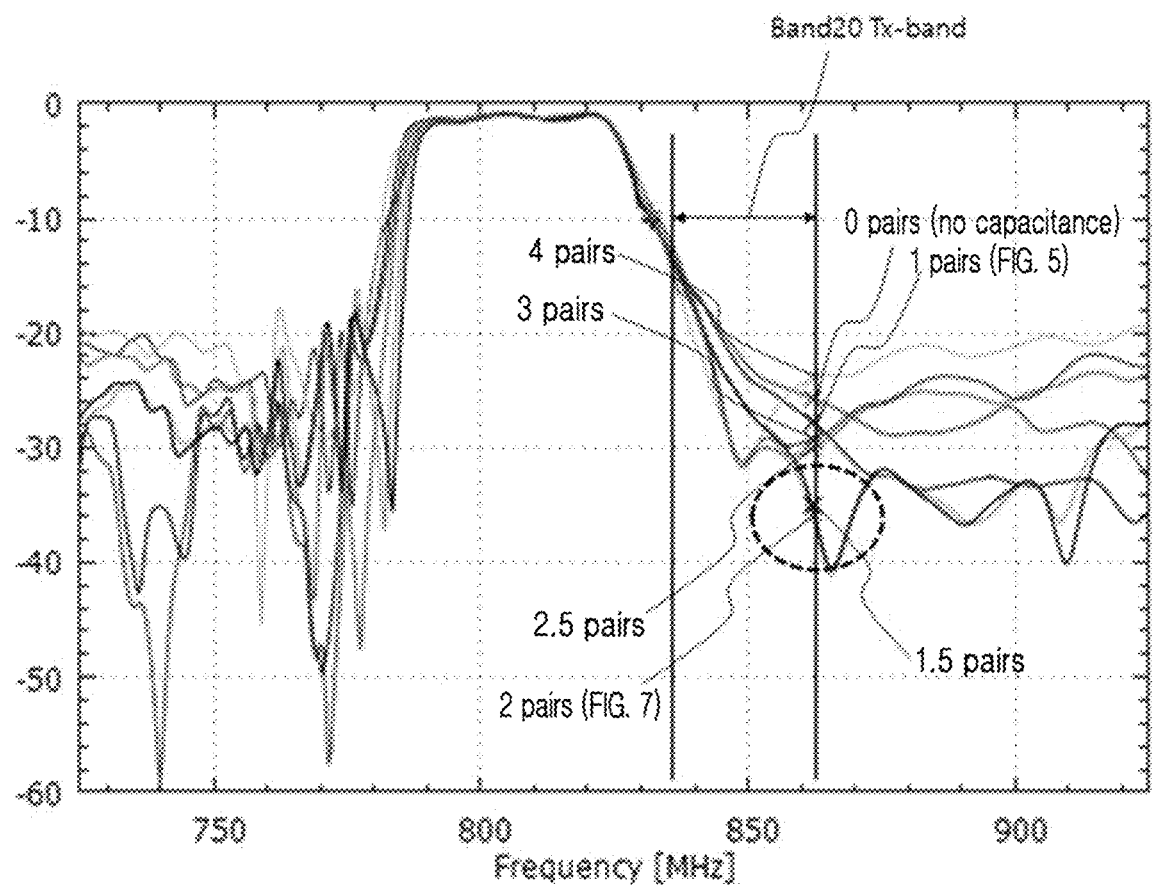
FIG. 8 is a graph showing an example of the characteristics of a reception band of the DMS filter shown in FIG. 7.

FIG. 8 is a graph showing an example of the characteristics of a reception band of the DMS filter (the case of Band20) shown in FIG. 7. In FIG. 8, the horizontal axis represents the frequency [MHz], and the vertical axis represents the amount of attenuation [dB].

As shown in FIG. 8, the transmission band of Band20 is located on the high-frequency side of the reception band of Band20. Therefore, it is desirable to increase, in the reception band of the DMS filter 100, the amount of attenuation in the transmission band of Band20.

The amount of attenuation corresponding to each number of pairs at a target frequency (here, 862 [MHz] as an example) is compared. Here, a DMS filter employing 0 pairs of Type 1 electrode fingers is the DMS filter shown in FIG. 3. In addition, a DMS filter employing a pair of Type 1 electrode fingers is the DMS filter shown in FIG. 5.

A DMS filter employing 2 pairs of Type 1 electrode fingers, a DMS filter employing 1.5 pairs of Type 1 electrode fingers, a DMS filter employing 2.5 pairs of Type 1 electrode fingers, and a DMS employing 3 pairs of Type 1 electrode fingers increase (improve) the amount of attenuation in this order at the target frequency, compared with the DMS filter employing a pair of Type 1 electrode fingers (FIG. 5).

Figure 9:
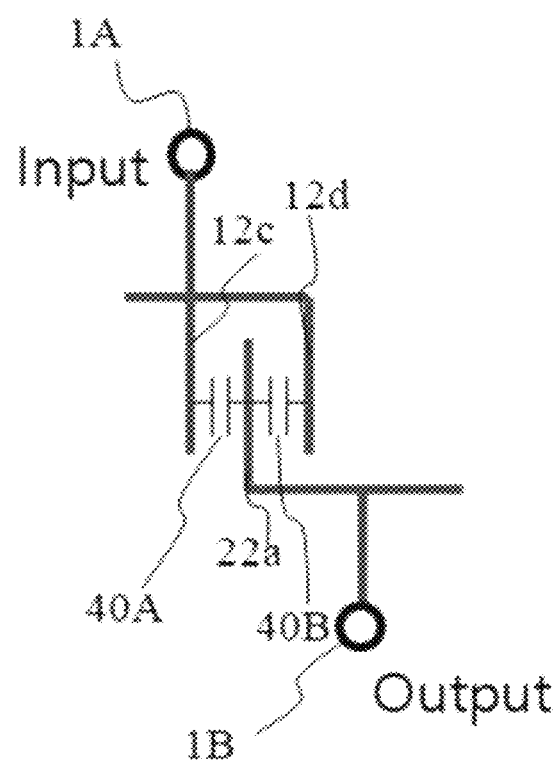
FIG. 9 is a mimetic view showing an example of the configuration of a part of a DMS filter employing 1.5 pairs of Type 1 electrode fingers.

Here, in the DMS filter employing 1.5 pairs of Type 1 electrode fingers, as a relation between the first IDT 10 and the second IDT 20, Type 1 electrode finger 12d of the first IDT 10, in addition to the one pair of Type 1 electrode fingers 12c and 22a, is provided to face (be adjacent to) the Type 1 electrode finger 22a as shown in FIG. 9. The 1.5 pairs of Type 1 electrode fingers like this may be equally applied between the second IDT 20 and the third IDT 30.

Figure 10:
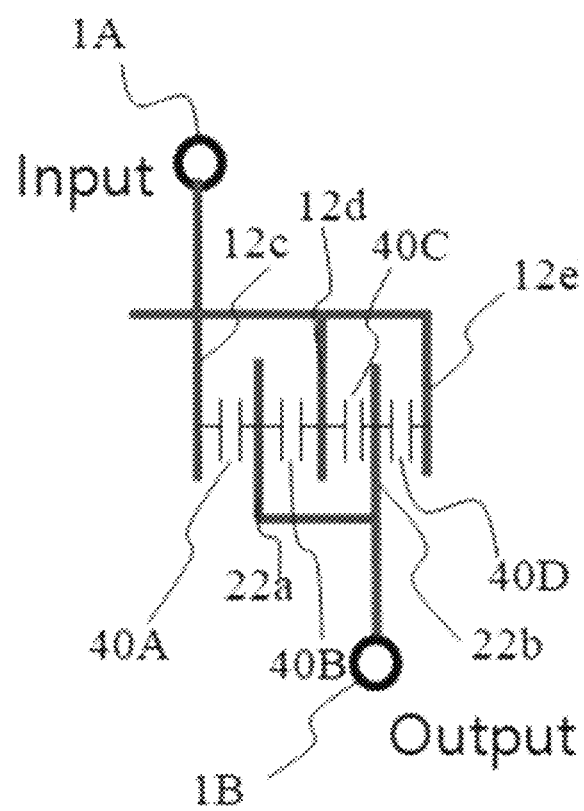
FIG. 10 is a mimetic view showing an example of the configuration of a part of a DMS filter employing 2.5 pairs of Type 1 electrode fingers.

On the other hand, in the DMS filter employing 2.5 pairs of Type 1 electrode fingers, as a relation between the first IDT 10 and the second IDT 20, Type 1 electrode finger 12e of the first IDT 10, in addition to the 2 pairs of Type 1 electrode fingers 12c, 22a, 12d and 22b, is provided to face (be adjacent to) the Type 1 electrode finger 22b as shown in FIG. 10. Accordingly, in addition to the capacitances 40A, 40B and 40C described with reference to FIG. 7, another capacitance 40D is formed between the Type 1 electrode finger 22b and the Type 1 electrode finger 12e. The 2.5 pairs of Type 1 electrode fingers like this may be equally applied between the second IDT 20 and the third IDT 30.

Figure 11:
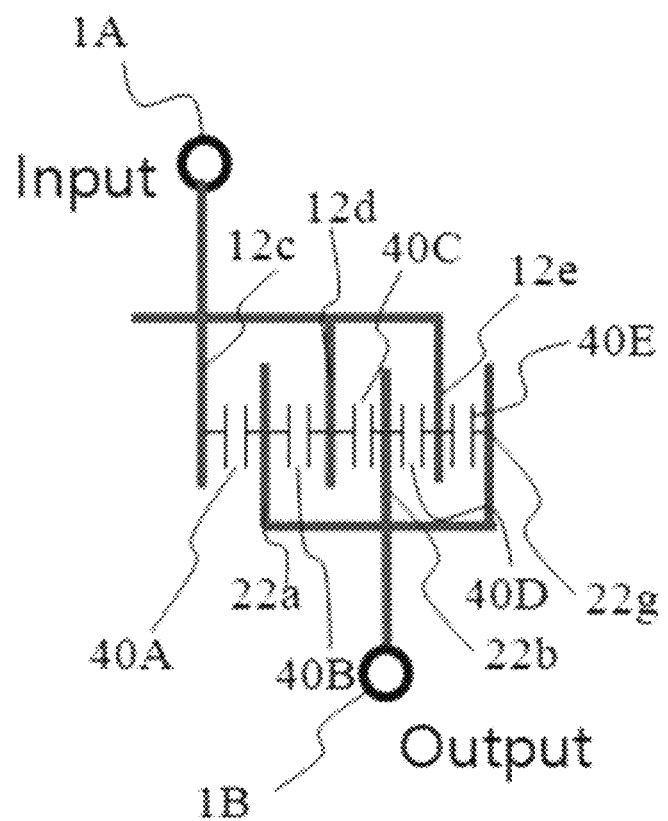
FIG. 11 is a mimetic view showing an example of the configuration of a part of a DMS filter employing 3 pairs of Type 1 electrode fingers.

On the other hand, in the DMS filter employing 3 pairs of Type 1 electrode fingers, as a relation between the first IDT 10 and the second IDT 20, Type 1 electrode finger 22g of the second IDT 20, in addition to the 2.5 pairs of Type 1 electrode fingers 12c, 22a, 12d, 22b and 12e, is provided to face (be adjacent to) the Type 1 electrode finger 12e as shown in FIG. 11. Accordingly, in addition to the capacitances 40A, 40B, 40C and 40D described with reference to FIG. 10, another capacitance 40E is formed between the Type 1 electrode finger 12e and the Type 1 electrode finger 22g. The 3 pairs of Type 1 electrode fingers like this may be equally applied between the second IDT 20 and the third IDT 30.

Figure 12:
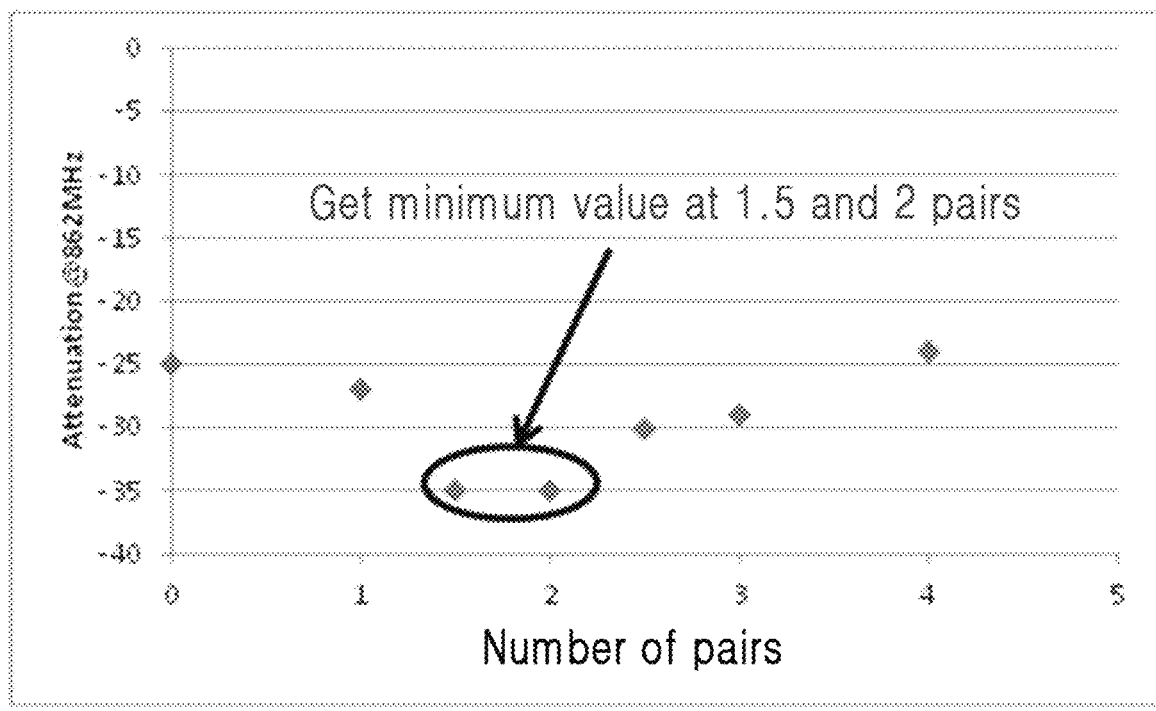
FIG. 12 is a graph showing the characteristics of a reception band of the DMS filter shown in FIG. 7 using another expression format.

The above experiment results are summarized in FIG. 12. FIG. 12 is a graph showing the characteristics of the reception band of the DMS filter shown in FIG. 7 using another expression format. In FIG. 12, the horizontal axis represents the number of pairs of Type 1 electrode fingers that are used, and the vertical axis represents the amount of attenuation [dB].

Considering FIGS. 12 and 8, it will be understood that a DMS filter employing 3 pairs of Type 1 electrode fingers is preferable, a DMS filter employing 2.5 pairs of Type 1 electrode fingers is more preferable, a DMS filter employing 1.5 pairs of Type 1 electrode fingers is further more preferable, and a DMS filter employing 2 pairs of Type 1 electrode fingers is most preferable.

3. Modified Example

Although a case of using three IDTs as a plurality of IDTs arranged on a piezoelectric substrate in the transverse direction has been described in the various embodiments described above, the number of used IDTs may be two, four or more. In any case, for at least one pair (or all pairs) of adjacent two IDTs among the plurality of IDTs, it is possible to employ any number of pairs of Type 1 electrode fingers among 1.5 pairs, 2 pairs, 2.5 pairs, and 3 pairs.

In addition, in each of the plurality of IDTs, the pitch formed between two adjacent Type 1 electrode fingers (Type 2 electrode fingers) may be constant along the length direction of the IDT or may be variable along the length direction of the IDT.

The DMS filter according to the various embodiments described above may be mounted on a duplexer.

The various embodiments described above may be applied in combination with each other as far as a contradiction does not occur.

As described above, according to various embodiments of the present invention, it is possible to dispose, in at least one pair of two adjacent IDTs, one Type 1 electrode finger of the IDT on the other side between two adjacent Type 1 electrode fingers of the IDT on one side or to dispose a plurality of pairs of Type 1 electrode fingers configured of one Type 1 electrode finger of the IDT on one side and one facing (adjacent) Type 1 electrode finger of the IDT on the other side. Accordingly, it is possible to form a capacitance between the input terminal (or output terminal) to which the Type 1 electrode finger of the IDT on one side is connected and the output terminal (or input terminal) to which the Type 1 electrode finger of the IDT on the other side is connected. The capacitance formed like this may increase the amount of attenuation in the attenuation band adjacent to the wide band side for the passband of the reception band of the DMS filter. Furthermore, since the capacitance like this is formed inside the DMS filter, space saving (miniaturization) of a product may be achieved. Accordingly, it is possible to provide a DMS filter capable of both improving the amount of attenuation in the attenuation band adjacent to the wide band side for the passband and miniaturizing a product by saving space.

According to the present invention, a double mode SAW (DMS) filter and a duplexer having improved performance can be provided.

According to the present invention, a DMS filter capable of improving the amount of attenuation in an attenuation band adjacent to the wide band side for the passband and miniaturizing a product by saving space can be provided.

The effects of the present invention are not limited to the effects mentioned above, and unmentioned other effects will be clearly understood by those skilled in the art from the description.

Although the embodiments of the present invention have been described with reference to the accompanying drawings, those skilled in the art may understand that the present invention can be implemented in other specific forms without changing the technical spirit or essential features. Therefore, it should be understood that the embodiments described above are illustrative and not restrictive in all respects.

What is claimed is:

1. A double mode SAW (DMS) filter comprising:
a plurality of interdigital transducers (IDTs), each having a plurality of Type 1 electrode fingers and a plurality of Type 2 electrode fingers formed on a piezoelectric substrate,
wherein in each of the plurality of IDTs, one Type 2 electrode finger among the plurality of Type 2 electrode fingers is disposed between two adjacent Type 1 electrode fingers among the plurality of Type 1 electrode fingers, and
wherein in a first IDT and a second IDT included in the plurality of IDTs to be adjacent to each other, one Type 1 electrode finger of the second IDT is disposed between two Type 1 electrode fingers of the first IDT to control capacitances between input and output terminals of the DMS filter,
wherein the capacitances formed between the input and output terminals are controlled by increasing or decreasing a number of pairs of the Type 1 electrode fingers each pair being composed of one Type 1 electrode finger of the first IDT and one Type 1 electrode finger of the second IDT, with a predetermined capacitance generated between each pair.

2. The DMS filter according to claim 1, wherein in the first IDT and the second IDT, one Type 1 electrode finger of the first IDT is disposed between two Type 1 electrode fingers of the second IDT to control the capacitances between the input and output terminals of the DMS filter.

3. The DMS filter according to claim 1, wherein in the first IDT and the second IDT, one Type 1 electrode finger of the second IDT is disposed between two adjacent Type 1 electrode fingers among three Type 1 electrode fingers of the first IDT to control the capacitances between the input and output terminals of the DMS filter.

4. The DMS filter according to claim 1, wherein in the first IDT and the second IDT, one Type 1 electrode finger of the first IDT is disposed between two adjacent Type 1 electrode fingers among three Type 1 electrode fingers of the second IDT to control the capacitances between the input and output terminals of the DMS filter.

5. The DMS filter according to claim 1, wherein in the second IDT and a third IDT included in the plurality of IDTs to be adjacent to each other, one Type 1 electrode finger of the third IDT is disposed between two Type 1 electrode fingers of the second IDT to control the capacitances between the input and output terminals of the DMS filter, wherein the capacitances formed between the input and output terminals are further controlled by increasing or decreasing a number of pairs of the Type 1 electrode fingers each pair being composed of one Type 1 electrode finger of the second IDT and one type 1 electrode finger of the third IDT, with a predetermined capacitance generated between each pair.

6. The DMS filter according to claim 5, wherein in the second IDT and the third IDT, one Type 1 electrode finger of the second IDT is disposed between two Type 1 electrode fingers of the third IDT to control the capacitances between the input and output terminals of the DMS filter.

7. The DMS filter according to claim 5, wherein in the second IDT and the third IDT, one Type 1 electrode finger of the third IDT is disposed between two adjacent Type 1 electrode fingers among three Type 1 electrode fingers of the second IDT to control the capacitances between the input and output terminals of the DMS filter.

8. The DMS filter according to claim 5, wherein in the second IDT and the third IDT, one Type 1 electrode finger of the second IDT is disposed between two adjacent Type 1 electrode fingers among three Type 1 electrode fingers of the third IDT to control the capacitances between the input and output terminals of the DMS filter.

9. The DMS filter according to claim 1, wherein each Type 1 electrode finger is connected to a signal line, and each Type 2 electrode finger is grounded.

* * * * *